United States Patent [19]

Wagner

[11] Patent Number: 5,100,285
[45] Date of Patent: Mar. 31, 1992

[54] SUPPORTING AND TRANSPORT APPARATUS

[75] Inventor: Rudolf Wagner, Fontnas, Switzerland

[73] Assignee: Balzers Aktiengesellschaft, Balzers, Liechtenstein

[21] Appl. No.: 512,662

[22] Filed: Apr. 20, 1990

[30] Foreign Application Priority Data

May 8, 1989 [DE] Fed. Rep. of Germany ....... 3915038

[51] Int. Cl.$^5$ ............................................. B25J 15/08
[52] U.S. Cl. ................................ 414/744.8; 414/225; 294/88; 294/119.1; 901/37; 901/32
[58] Field of Search .......... 414/217, 225, 741, 744.3, 414/744.2, 744.8; 901/46, 37, 32; 294/119.1, 67.33, 81.54, 81.62, 88

[56] References Cited

U.S. PATENT DOCUMENTS

| | | | |
|---|---|---|---|
| 2,789,716 | 4/1957 | Wolf | 414/741 X |
| 4,252,358 | 2/1981 | Klebs | 294/67.33 |
| 4,336,926 | 6/1982 | Inagaki et al. | 901/37 |
| 4,865,375 | 12/1989 | Laub et al. | 294/88 |
| 4,913,613 | 4/1990 | Hirschmann | 901/37 X |
| 4,990,047 | 2/1991 | Wagner et al. | 414/226 X |

FOREIGN PATENT DOCUMENTS

| | | | |
|---|---|---|---|
| 1804005 | 10/1968 | Fed. Rep. of Germany | 294/88 |
| 0235219 | 4/1986 | German Democratic Rep. | 294/119.1 |
| 0248694 | 8/1987 | German Democratic Rep. | 901/37 |
| 0074544 | 4/1987 | Japan | 901/37 |
| 0300288 | 12/1966 | Sweden | 294/88 |
| 2137160 | 10/1984 | United Kingdom | 294/119.1 |

OTHER PUBLICATIONS

Hansen, H. E. et al., "Convertible Wafer Size Gripper Assembly", IBM Technical Disclosure Bulletin, vol. 22, No. 1, Jun. 1979.

Primary Examiner—Robert J. Spar
Assistant Examiner—William M. Hienz
Attorney, Agent, or Firm—Notaro & Michalos

[57] ABSTRACT

In order to treat disk-shaped bodies, specifically semiconductor disks in a vacuum plant, they must be transported and deposited between stations. A given disk is supported at its edge by two supporting arms each having two fingers and supporting surfaces at four edge sections of the disk distributed along the circumference of the disk. In order to grasp or release the disk by decreasing or increasing the distance between the supporting arms, both supporting arms are mounted to a respective piston/cylinder unit. In such units a respective cylinder moves relative to a stationary piston rod. The ends of both piston rods are thereby mounted oppositely of each other to a rotation axle extending perpendicularly to the axes of the cylinders by means of which the two piston/cylinder units can be pivoted together with the supporting arms from one station to the other station within the vacuum plant. The two piston/cylinder units are operated by a pressurized medium fed via conduits through the hollow piston rods to move the supporting arms away from each other and against the action of a pressure spring positioned inside of the cylinder and resting against the cylinder and the piston and active for the opposed stroke movement.

5 Claims, 3 Drawing Sheets

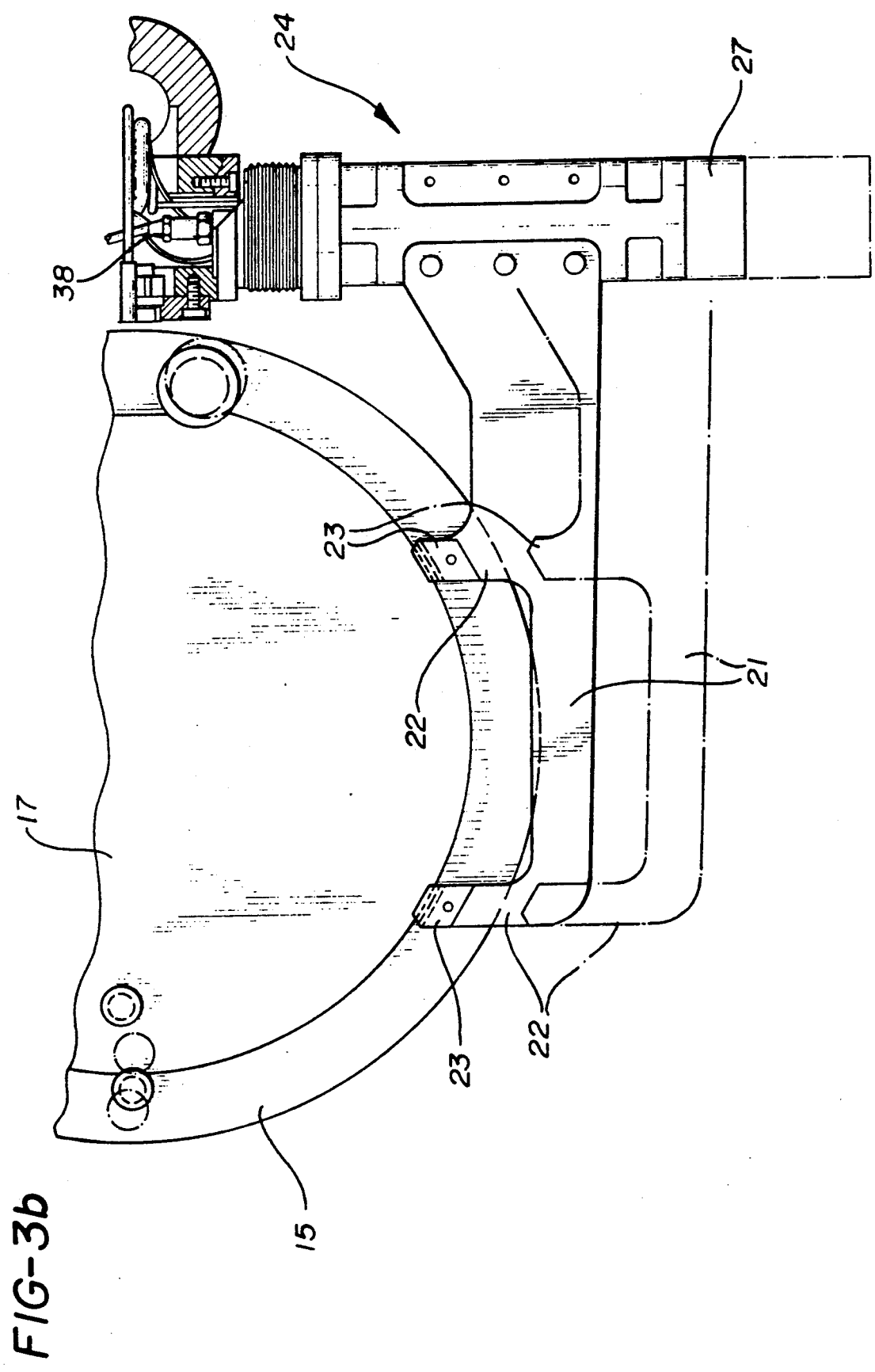

SUPPORTING AND TRANSPORT APPARATUS

BACKGROUND OF THE INVENTION

1. Field of the Invention

The present invention relates to a supporting and transport apparatus for transporting and transferring of a disk, specifically between stations of an evacuable chamber of a vacuum plant which includes at least one movable disk support onto which the disk is to be deposited by means of the supporting and transport apparatus.

2. Description of the Prior Art

Such disks may be for instance semiconductor disks which must pass a plurality of treatment steps within a vacuum plant. To this end the vacuum plant includes a plurality of treatment chambers for the semiconductor disks and a central evacuable distributing chamber into which the semiconductor disks are brought through locks and from which they are removed after the treatment. If a disk after the termination of its treatment in a treatment chamber is transported through the distribution chamber into the subsequent treatment chamber there exists in case of very sensitive treatments the danger that residual gases which are for instance needed for a treatment step in a treatment chamber reach and enter into a different treatment chamber such that they disturb the subsequent treatment to be made therein. There is, furthermore, a danger that particles which are stirred up at one of the treatments are dragged along during the transport into the subsequent chamber. It is also possible that particles from the surrounding environment can be brought into the distribution chamber by the not as yet treated semiconductor disks and settle when passing by on the partly already treated semiconductor disks such that a subsequently made treatment is detrimentally influenced thereby. In order to avoid such, an evacuable intermediate chamber is arranged between the distribution chamber and the at least one treatment chamber, and which is sealable by means of valves. The semiconductor disks do no longer come into contact with the distribution chamber between different treatment steps in a plurality of treatment chambers such that the danger of dragging residual gases or particles along can be substantially excluded.

A transport apparatus is located in the distribution chamber which is suitable to remove from a lock chamber ahead of the distribution chamber the disks of the magazine which disks are located in such magazine on top of each other, whereby this transport apparatus is preferably a robot arm moving under the disk. If now sealable intermediate chambers are present following the distribution chamber from which intermediate chambers only the further transporting into the treatment chambers is accomplished, a further transporting device must be present in the intermediate chambers which takes a respective disk over from the robot arm.

SUMMARY OF THE INVENTION

A general object of the present invention is to provide a supporting and transport apparatus for transporting and transferring of a disk-shaped body or disk generally and specifically such a transporting apparatus for an intermediate chamber which must meet the conditions of depositing one respective disk into treatment chambers adjacent one intermediate chamber and to take over a disk from the robot arm for a transporting thereof further such that no contact will prevail between the two transport apparatuses in order to completely exclude a dragging along of particles along said mentioned transporting path.

A further object of the invention is to provide a supporting and transport apparatus which has at least two substantially homologously, i.e. mirror-inverted structured supporting arms each of which including at least two fingers located at a distance from each other and supporting surfaces extending in the same plane and located at the ends of the fingers and intended to support the circumferential edge of a disk at at least four edge sections distributed along the circumference of the disk. This is done by means of two simultaneously operable moving units, each carrying a supporting arm, in order to decrease or increase their mutual distance. The arms are simultaneously movable toward the center of the disk and away therefrom respectively in order to support or release a disk. A plurality of intermediate chambers having each one such supporting and transport apparatus can be arranged around one distribution chamber located at the center. A robot arm is present in the distribution chamber and does not form part of the invention. This arm is retractable and extendable and moves into the intermediate chamber after the opening of a valve located between the distribution chamber and the intermediate chamber. The arm supports the disk to be treated at its bottom side, and the supporting and transport apparatus present in the intermediate chamber must hold or support the disk under its circumferential edge such that the transfer of the disk can be accomplished without any contact between the two transport apparatuses. A further plurality of sealable treatment chambers can border further an intermediate chamber at its top side and thus be located one floor higher and into which the disks are brought by aid of lifting tables located in the intermediate chamber of which the centers are located on a circle. The duty of the inventive supporting and transport apparatus is then to place a respective disk onto one of the lifting tables to which end the inventive supporting and transport apparatus is preferable rotatable around a central axis in order to be able to place a disk onto each of the lifting tables present.

BRIEF DESCRIPTION OF THE DRAWING

The invention will be better understood and objects other then those set forth above, will become apparent when consideration is given to the following detailed description thereof. Such description makes reference to the annexed drawings wherein:

FIG. 3b illustrates another embodiment of the invention.

DESCRIPTION OF THE PREFERRED EMBODIMENTS

Figure 1:
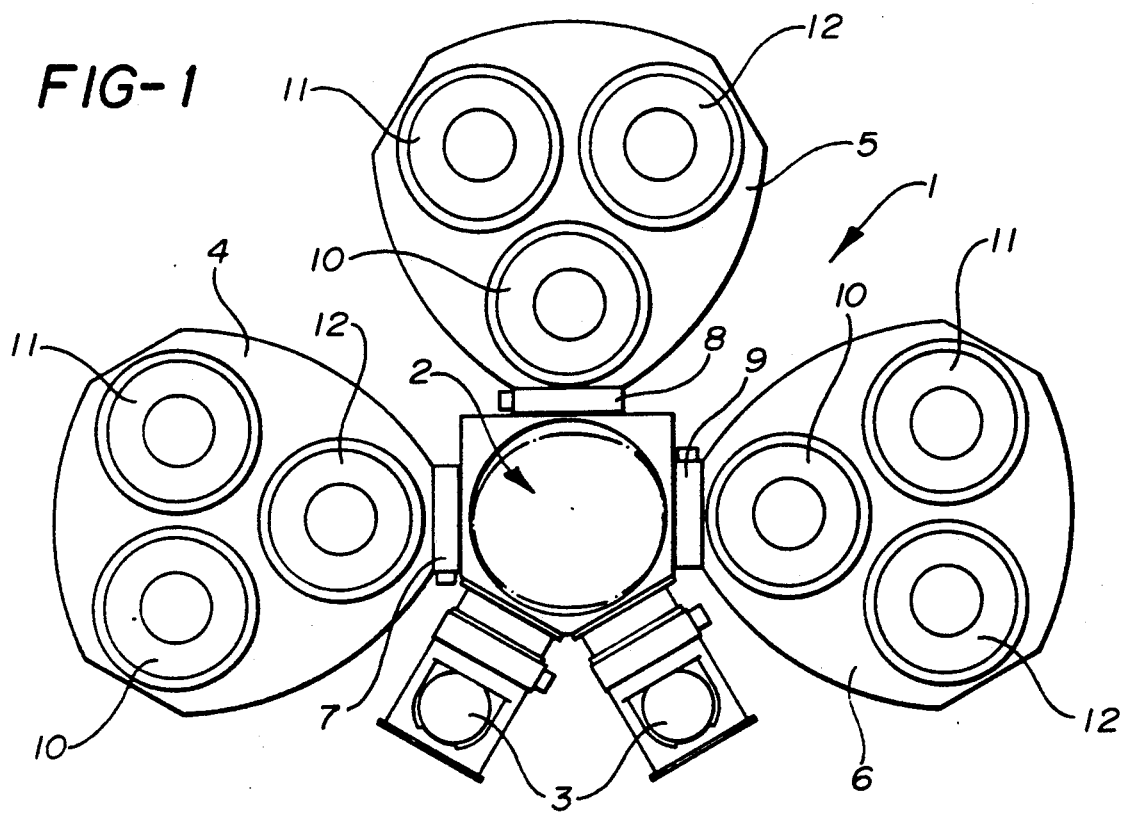
FIG. 1 is a top view of a vacuum plant having one distribution chamber and three intermediate chambers, each intermediate chamber bordering, in turn, three treatment chambers.

The vacuum plant 1 illustrated in FIG. 1 on a schematic basis only, comprises a central distribution chamber 2 into which the semiconductor disks are fed and out of which they are retrieved after their treatment via lock chambers 3. The distribution chamber 2 is bordered at three sides by intermediate chambers 4, 5 and 6 whereby valves 7, 8 and 9 are arranged between the intermediate chambers and the central distribution chamber 2 which valves are opened and closed by a not particularly illustrated control facility in accordance with the treatments to be made. On top of each of the intermediate chambers 4, 5 and 6 three sealable treatment chambers 10, 11 and 12 are located. The disks to be treated are fed by means of respective lifting tables into the treatment chambers which procedure is not particularly illustrated, whereby the raised lifting table seals at the same time the connection between treatment chamber and intermediate chamber such that the treating of the disk is accomplished in the then sealed treatment chamber.

Figure 2:
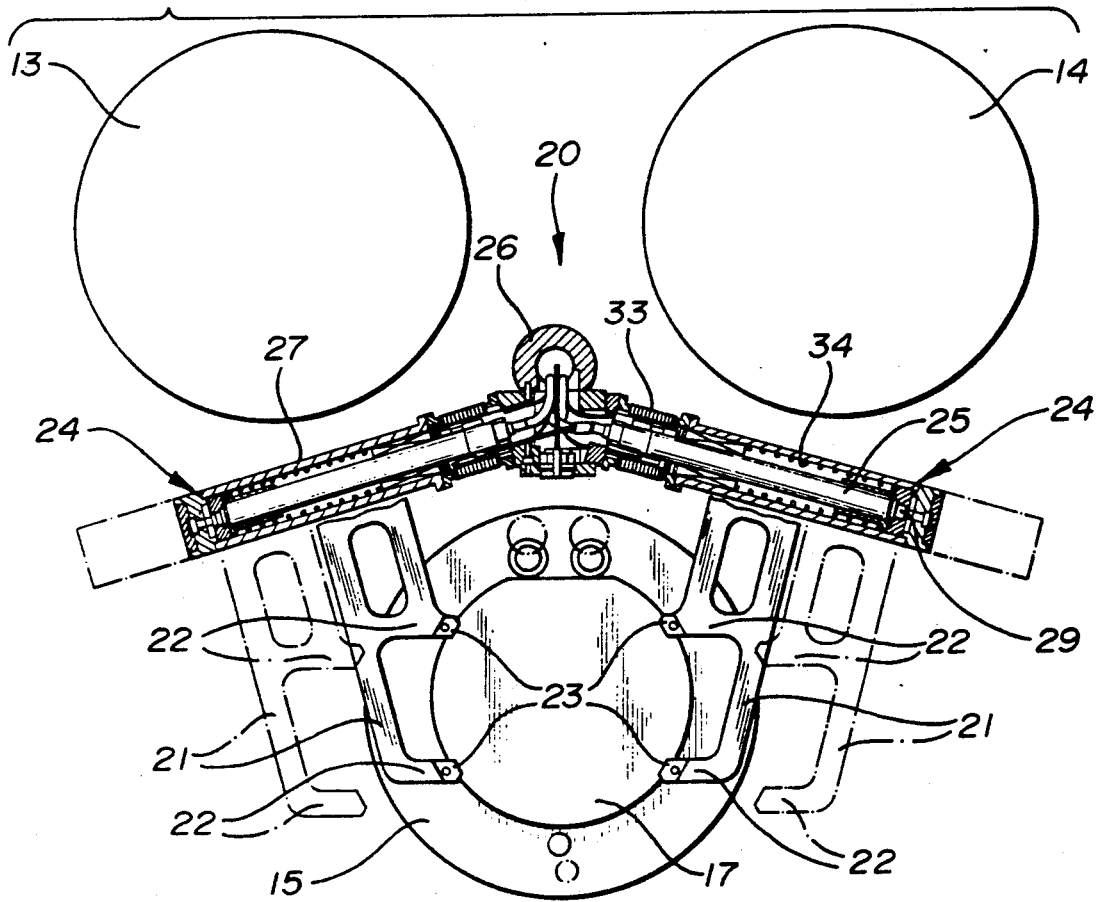
FIG. 2 is a view of a horizontally partly cut supporting and transport apparatus and showing schematically its relation relative to three lifting tables.

A respective supporting and transport apparatus structured in accordance with the invention and in accordance with FIG. 2 and not illustrated in FIG. 1 is located in the center of each intermediate chamber 4, 5 and 6. In order to bring the disks into the treatment chambers located on top of the intermediate chamber, along a circle, three lifting tables 13, 14 and 15 are necessary which are schematically illustrated in FIG. 2 as circles. These lifting tables are located exactly under the treatment chambers 10, 11 and 12. FIG. 2 illustrates thus on an enlarged scale schematically the structures present in the intermediate chamber 5.

Figure 3A:
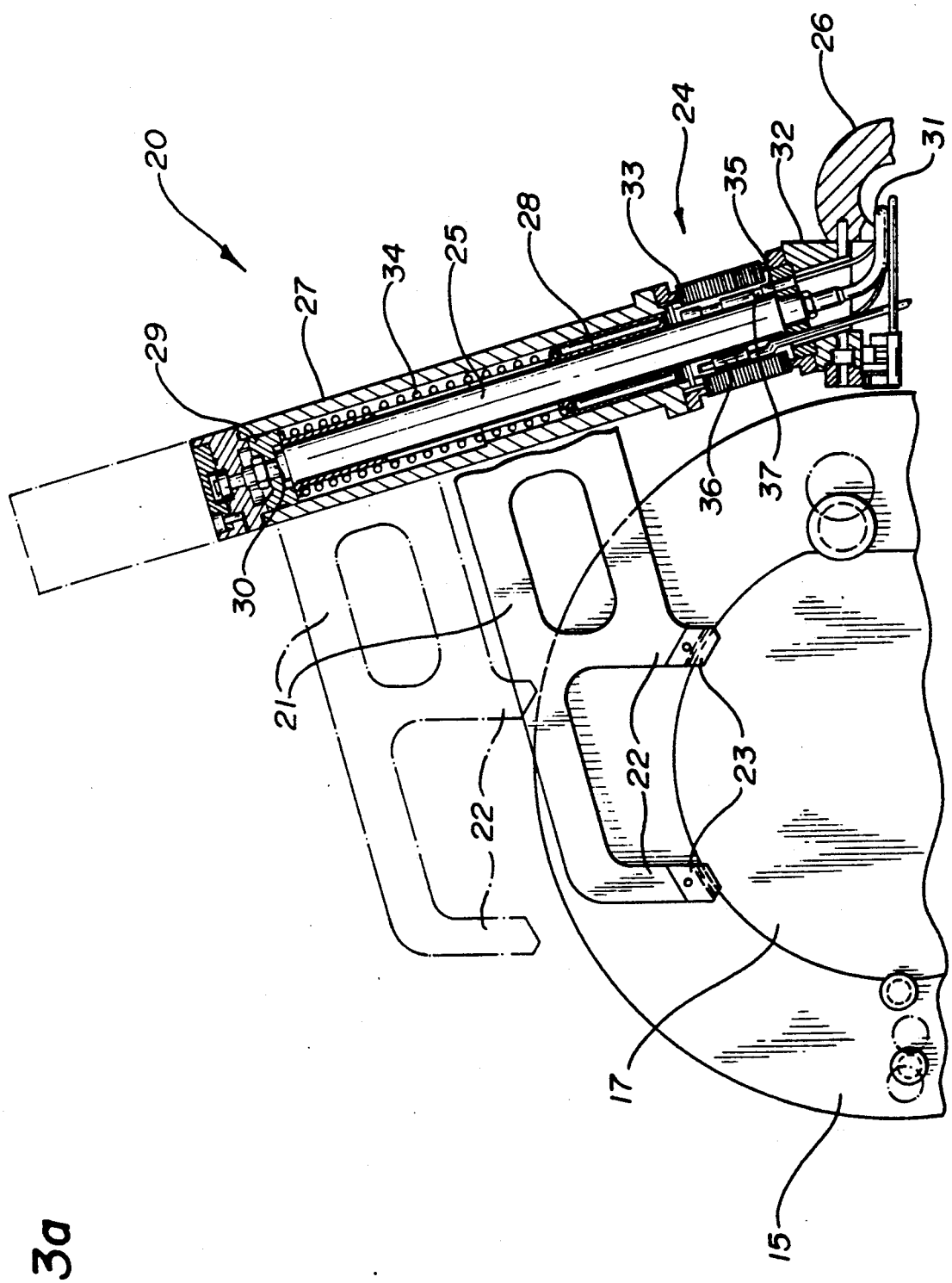
FIG. 3a illustrates one different embodiment of the apparatus of FIG. 2 on an enlarged scale.

The robot arm which is located in the distribution chamber and which is not illustrated, transports a disk 17 to be treated into the intermediate chamber 5 and there over the lifting table 15 located therein. There, the disk 17 is taken over by the inventive supporting and transport apparatus 20 which is illustrated in FIGS. 3a and 3b on a enlarged scale and whereby two embodiments are illustrated which additionally can be operated for disks having various diameters. Accordingly, only half of the apparatus 20 in accordance with FIG. 2 is illustrated in FIGS. 3a and 3b, respectively, which is to be mentally completed homologously relative to the central axis of symmetry of the apparatus in each figure.

The apparatus 20 comprises two homologously identically structured supporting arms 21 each comprising two respective fingers 22 located at a distance from each other and having supporting surfaces 23 at the ends of the fingers which all are located in the same plane and which, in the position of the supporting arms 21 illustrated with full lines in FIGS. 2 and 3a, support the disk 17 to be treated under four edge sections distributed along their circumference whereby the supporting arms 21 are not allowed to press against the circumference of the disk. In order to decrease and increase the distance between the two supporting arms 21 or to move the supporting arms simultaneously toward the center of the disk 17 or away therefrom, each supporting arm 21 is mounted to a piston/cylinder unit 24 (hydraulic or pneumatic working cylinder). The ends of the piston rods 25 of the two identically designed and homologously arranged piston/cylinder units 24 are mounted oppositely of each other to a rotation axle 26 extending perpendicularly to the axes of the piston/cylinder units. This axle 26 is rotatably arranged inside of the respective intermediate chamber 4, 5 and 6, respectively. A cylinder 27 is guides against rotation on the stationary arranged piston rod 25 and the supporting arm 21 is mounted at the outside to this cylinder. The guiding is accomplished by a ballbearing sleeve 28 between the piston rod 25 and the cylinder and designed such that a rotating of the piston rod and cylinder relative to each other is not possible. The piston rod 25 is hollow and supports at its end remote from the mounted end a piston 29 having an axial through bore or passage 30.

A conduit 31 for a pressurized medium, e.g. pressurized air is connected to the mounted end of the piston rod 25. Both conduits 31 which lead to the two piston/cylinder-units 24 extend through the hollow rotation axle 26 which additionally supports two oppositely located flanges 32 to which flanges the one end of a respective bellows 33 is mounted and of which the opposite end is mounted to the free end of the cylinder 27. When the piston/cylinder unit 24 is operated the cylinder 27 moves due to the pressure of the pressurized medium outwardly into the position indicated by dash-dotted lines and the supporting arm 21 is then also in the position illustrated with dash-dotted lines. In this position every one of the supporting arms 21 is located just outside of the lifting table 15 located thereunder such that the lifting table after the disk to be treated has been deposited on the top surface of the lifting table can pass by the supporting arms upwardly into the treatment chamber.

The opposite movement of the cylinder 27 into its initial position proceeds by the force of a spiral pressure and return spring 34 which surrounds the piston rod 25 and rests at one of its ends against the piston 29 and at the other end against the cylinder 27. For both end positions of the extendable and retractable cylinder 27 sensor elements 35 and 36 are arranged under the metal bellows 33. When the cylinder 27 is retracted a finger 37 mounted to the cylinder 27 and moving therewith is located directly in front of the sensor element 35 while a further finger end 38 will be located in front of the sensor element 36 when the cylinder 27 is extended.

The piston/cylinder units 24 are simultaneously operated by pressurized air and because they are located in an evacuable intermediate chamber 4, 5 or 6, respectively they must be sealed hermetically which is achieved by the metal bellows 33.

In FIG. 2 three lifting tables 13, 14 and 15 are illustrated schematically of which the centers are located on a circle having a angular division of 120°. As mentioned, the lifting tables move upwards and downwards parallel to the rotation axle 26 and in order that the lifting tables can be arranged closely together the two cylinders 27 of the apparatus according to FIG. 2, which must be positioned in the empty space between neighboring lifting tables enclose together a obtuse angle. If the space conditions do not necessitate this arrangement of the cylinders and if for instance only one lifting table or two oppositely located lifting tables are present the two piston/cylinder units 24 can be arranged such as illustrated in FIG. 3b, namely in a rectilinear extension oppositely of each other. FIG. 3b discloses that the supporting arms 21 are respectively mounted to the upper side of the cylinder 27. FIG. 3b discloses further that it is possible to support and transport disks 17 to be treated having various diameters by the apparatus and supporting arms 21. In of FIG. 3a a smaller and in FIG. 3b a disk having a larger diameter are illustrated, which is deposited on the same lifting table 15 and it is obvious that in case of the larger disk the path of the supporting arm up to the dash-dotted position outside of the lifting table 15 and accordingly the requisite stroke of the cylinder 27 of the apparatus is smaller as in case of the smaller disk. In all the figures the same numbers are used to depict the same or functionally similar parts.

While there are shown and described present preferred embodiments of the invention, it is to be distinctly understood that the invention is not limited thereto, but may be otherwise variously embodied and practiced within the scope of the following claims.

What is claimed is:

1. An apparatus comprising:
   a vacuum chamber for containing a disk to be transported in the vacuum chamber;
   a common rotation axle mounted for rotation around a rotation axis in said vacuum chamber;
   two moving units connected to said axle, said moving units being spaced from each other and rotatable around said rotation axis, each of said moving units comprising a piston/cylinder unit operated by a pressurized medium, said piston/cylinder unit comprising a hollow piston rod which acts as a passage for the pressurized medium, said piston rod being fixed with respect to said axle and extending outwardly from said axle, a piston connected to said piston rod at a location spaced away from said axle, a cylinder slidably mounted to and sealingly engaged with said piston, said pressurized medium moving through said piston rod into said cylinder causing said cylinder to move outwardly with respect to said axle to make an outward stroke movement, and a spring engaged between said piston rod and said cylinder for resisting the outward stroke movement of said cylinder and for moving said cylinder inwardly toward said axle along an inward stroke movement when the pressurized medium is released; and
   two substantially homologously structured supporting arms each including at least two fingers located at a distance from each other, each finger including a supporting surface extending in a common plane which is transverse to said rotation axis, and located at ends of said fingers for engagement under an area near the circumferential edge of the disk, so that the disk is supported between said supporting arms on said supporting surfaces at least four points, wherein said circumferential edge is free from contact with the arms, each supporting arm being connected to the respective cylinders of said moving units, wherein said inward stroke movement of said cylinders moves said supporting arms toward each other and toward the center of the disk, and wherein said outward stroke movement of said cylinders moves said supporting arms away from each other and away from the center of the disk in order the release the disk.

2. The apparatus of claim 1, wherein a metal bellows connects the respective cylinder ends nearest the axle to a flange mounted to said rotation axle for sealing each entire piston/cylinder unit with respect to the vacuum chamber.

3. The apparatus of claim 2, wherein a pressurized medium supply conduit for said moving units is lead through the rotation axle which is hollow.

4. The apparatus of claim 3, in which said moving units are designed as double moving piston/cylinder units.

5. The apparatus of claim 4, wherein sensor elements for electrically transmitting an indication of the respective degree of stroke of said moving units are associated with said moving units.

* * * * *